United States Patent
Dempsey

(10) Patent No.: US 9,077,376 B2
(45) Date of Patent: Jul. 7, 2015

(54) MULTIPLE STRING DIGITAL TO ANALOG CONVERTER COMPRISING A CONTROL CIRCUIT

(71) Applicant: Analog Devices Technology, Hamilton (BM)

(72) Inventor: Dennis A. Dempsey, Newport (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/214,405

(22) Filed: Mar. 14, 2014

(65) Prior Publication Data

US 2014/0285369 A1    Sep. 25, 2014

Related U.S. Application Data

(60) Provisional application No. 61/793,777, filed on Mar. 15, 2013.

(51) Int. Cl.
| | | |
|---|---|---|
| *H03M 1/66* | (2006.01) | |
| *H03M 1/68* | (2006.01) | |
| *H03M 1/00* | (2006.01) | |
| *H03M 1/06* | (2006.01) | |
| *H03M 1/76* | (2006.01) | |

(52) U.S. Cl.
CPC ...... *H03M 1/68* (2013.01); *H03M 1/00* (2013.01); *H03M 1/06* (2013.01); *H03M 1/682* (2013.01); *H03M 1/765* (2013.01); *H03M 1/66* (2013.01)

(58) Field of Classification Search
CPC ........ H03M 1/66; H03M 1/765; H03M 1/682
USPC .................................. 341/144, 118, 154, 153
See application file for complete search history.

(56) References Cited

U.S. PATENT DOCUMENTS

| | | | |
|---|---|---|---|
| 4,491,825 A | 1/1985 | Tuthill | |
| 4,543,560 A | 9/1985 | Holloway | |
| 4,918,448 A | 4/1990 | Hauviller et al. | |
| 5,075,677 A | 12/1991 | Meaney et al. | |
| 5,495,245 A | 2/1996 | Ashe | |
| 5,554,986 A * | 9/1996 | Neidorff | 341/145 |
| 5,648,780 A | 7/1997 | Neidorff | |
| 5,703,588 A | 12/1997 | Rivoir et al. | |
| 5,764,174 A | 6/1998 | Dempsey et al. | |
| 5,969,657 A * | 10/1999 | Dempsey et al. | 341/145 |
| 5,999,115 A | 12/1999 | Connell et al. | |
| 6,252,534 B1 | 6/2001 | Timko | |
| 6,414,616 B1 | 7/2002 | Dempsey | |
| 6,567,026 B1 | 5/2003 | Gorman | |
| 6,781,536 B1 | 8/2004 | Martins | |
| 6,914,547 B1 | 7/2005 | Swaroop et al. | |
| 7,136,002 B2 | 11/2006 | Dempsey et al. | |
| 7,283,079 B2 | 10/2007 | Jain | |
| 7,339,508 B2 | 3/2008 | Cosgrave et al. | |

(Continued)

OTHER PUBLICATIONS

Non-Final Office Action in U.S. Appl. No. 14/214,180 mailed Oct. 15, 2014, 13 pages.

(Continued)

*Primary Examiner* — Brian Young

(57) ABSTRACT

A multi-string DAC is described and comprises at least two DAC stages. Each DAC stage comprises a string of impedance elements and a switching network. A control loop is provided to control the Ron of the switching network and provide code dependent control of switches in a DAC switching network.

28 Claims, 7 Drawing Sheets

(56) References Cited

U.S. PATENT DOCUMENTS

| | | |
|---|---|---|
| 7,372,387 B2 | 5/2008 | Li et al. |
| 7,375,669 B2 * | 5/2008 | Kim et al. .................... 341/145 |
| 7,382,302 B2 | 6/2008 | Muramatsu et al. |
| 7,443,326 B2 | 10/2008 | Raphaeli |
| 7,453,385 B2 | 11/2008 | Hino |
| 7,474,245 B1 * | 1/2009 | Wang et al. .................... 341/145 |
| 7,796,060 B2 | 9/2010 | Oberhuber et al. |
| 7,804,432 B2 | 9/2010 | Fakuzawa et al. |
| 7,808,412 B2 | 10/2010 | Fakuzawa et al. |
| 7,924,202 B2 | 4/2011 | Fakuzawa et al. |
| 7,956,786 B2 * | 6/2011 | Cosgrave .................... 341/145 |
| 2008/0100489 A1 | 5/2008 | Trifonov et al. |
| 2014/0132435 A1 | 5/2014 | Dempsey |
| 2014/0167997 A1 | 6/2014 | Dempsey |
| 2014/0266838 A1 | 9/2014 | Dempsey |
| 2014/0285369 A1 | 9/2014 | Dempsey |
| 2014/0313066 A1 | 10/2014 | Dempsey |

OTHER PUBLICATIONS

Non-Final Office Action in U.S. Appl. No. 14/214,341 mailed Oct. 7, 2014, 11 pages.

Notice of Allowance in U.S. Appl. No. 14/214,180 mailed Feb. 20, 2015, 7 pages.

* cited by examiner

MULTIPLE STRING DIGITAL TO ANALOG CONVERTER COMPRISING A CONTROL CIRCUIT

PRIORITY DATA

This application is a non-provisional of U.S. Provisional Patent Application Ser. No. 61/793,777, filed Mar. 15, 2013, which is hereby incorporated by reference in its entirety.

FIELD

The present application relates to digital to analog converters (DACs) and particularly to a DAC implemented using multiple switched strings and comprising a control circuit. Such configurations are particularly suited for integrated circuit fabrication using, for example, MOS technology.

BACKGROUND

Digital to Analog Converters or DACs are well known in the art and are used to decode a digital input signal to a corresponding output analog signal. Examples of such DACs are described in co-assigned U.S. Pat. No. 5,969,657, the content of which is incorporated herein by way of reference.

Other known DAC configurations are described in co-assigned U.S. Pat. No. 7,136,002, again incorporated herein by way of reference, which describes a dual string DAC configuration implemented using a high impedance intermediate static state.

These types of DAC configurations have found widespread use and application. Despite their advantages there is always a need for improved arrangements and particularly for circuitry that provides improved precision.

SUMMARY

There is provided in accordance with one aspect of the present teaching a multi-string digital to analog converter, DAC, which is coupled to a control circuit. The control circuit is configured to operably vary "ON" gate drive reference level(s) for multiplexer (MPX) circuit elements of the DAC. In this way it is possible to impedance match these elements to a reference impedance independent of DAC code, common-mode and other variance sources e.g. supply, process, layout dependent, reference voltages, stress and temperature variations. In accordance with the present teaching it is possible to provide a substantially constant total switch impedance verses input code and other variance mechanisms so as to minimize DC or static errors and maximize precision. This provides an improvement in power supply rejection, PSRR, and DC/static stability verses temperature. In exemplary arrangements, the reference impedance may be matched to impedance elements of a resistor string within the DAC. It will be understood that this control may also be used to account for variances due to process, voltage and temperature (PVT) as well as reference voltage variations and other system variables. By providing this control, the present teaching advantageously provides a reduction in the on resistance, Ron, DC or static error variance contribution of MOS switches in multi-string DACs.

Accordingly, a first aspect of the present teaching provides a DAC comprising a multi-string switch Ron control which is configured to operably vary control signals. In this way, the Ron of MOS switch(es) which are controlled via gate voltages at a switch common mode level is such that the impedance of a DAC multiplexer, MPX, is substantially controlled verses a reference target impedance.

Such impedance switch control can be used with many variations of multi-string DAC architectures to improve precision performance. For example, such Ron control can be used with multi-string DACs to control the key, MSB switch Ron and thus improve INL and DNL of the DAC function.

Accordingly the present teaching provides a DAC as provided in accordance with the independent claims. Advantageous features are detailed in the dependent claims.

BRIEF DESCRIPTION OF THE DRAWINGS

The present application will now be described with reference to the accompanying drawings in which.

DETAILED DESCRIPTION OF THE DRAWINGS

The present teaching will now be described with reference to exemplary arrangements implemented in the form of a multi-string DAC 100 such as that shown in FIG. 1. It will be appreciated that a multi-string DAC may also be considered a multi-stage DAC where each stage comprises a string of impedance elements. A DAC per the present teaching does not require a buffered architecture. Conventional DACs are implemented using binary transitions but in accordance with the present teaching, there is no limiting requirement for such binary transitions, although the circuits will be described in that context. Therefore where the present disclosure refers to MSB and LSB transitions, which are typically interpreted in the context of a binary state change reflecting specifics of a digital input code, within the context of the present teaching these should be interpreted more generally as state changes which do not necessarily represent a binary transition.

It will be appreciated that a multi-string DAC may also be considered a multi-stage DAC where each stage comprises a string of impedance elements. In such a multi-string converter, a first stage uses a first string for converting a group of higher order bits of an N-bit digital word and a second stage using a second string to decode the remaining, lower order bits.

Within the context of the following, which is provided to assist the person of skill in an understanding of features and benefits of an arrangement in accordance with the present teaching, each of the strings will be described with reference to an exemplary implementation using resistors. It will be appreciated that resistors are an example of the type of impedance element that may be used and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. In other strings where the voltage is relatively small, other elements such as active MOS devices may also be used. The present teaching should therefore not be construed as being limited to a multi-resistor string DAC.

Figure 1:
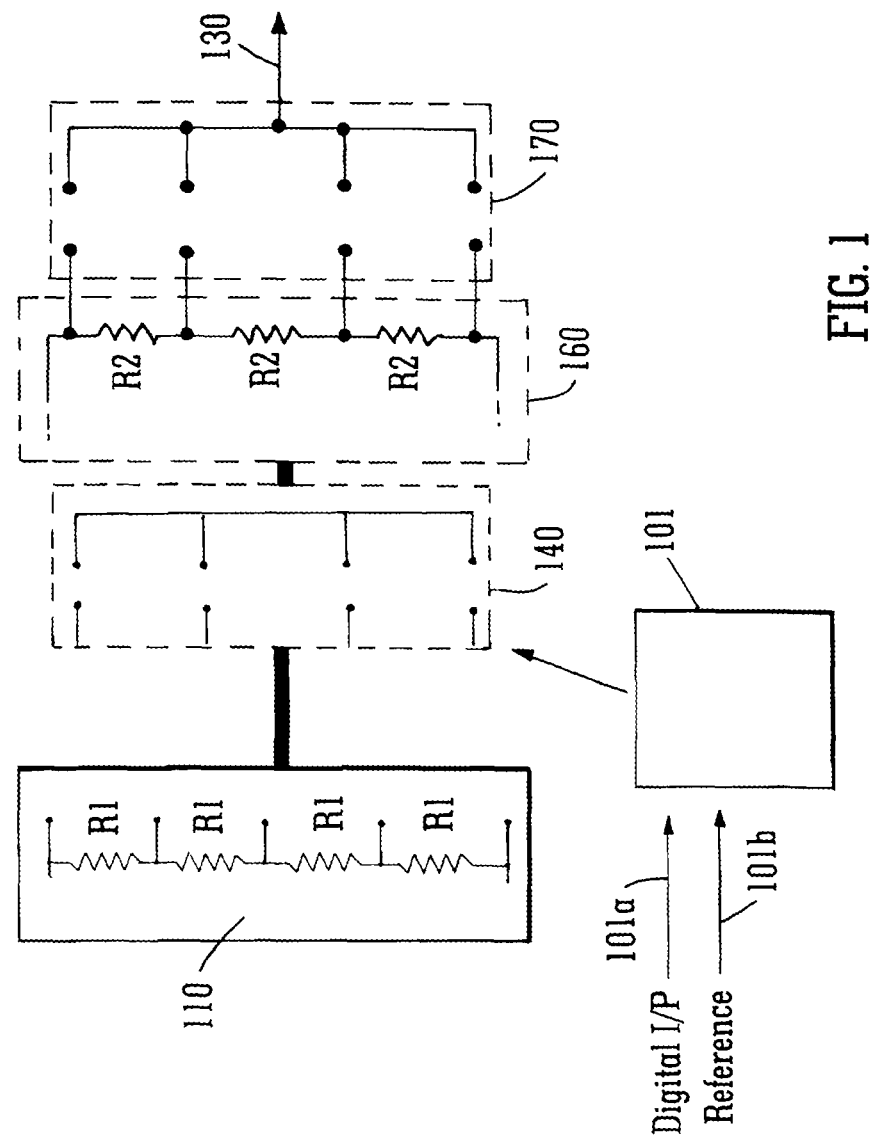
FIG. 1 is a block schematic showing how, in accordance with the present teaching, a control circuit may be used to control switch impedance.

In the example of FIG. 1, a two stage DAC is provided and each stage comprises a string of impedance elements. For example, in FIG. 1, a first stage comprises a string 110 of impedance elements shown in this example as resistors of value R1 coupled to switch network 140. Judicious switching effectively changes the impedance provided by this first stage.

A second stage comprises a second string 160 of impedance elements, shown again in this example as resistors of nominal value R2 switchably coupled to a switch network 170.

The switch network 140 is an intermediate switch network to each of the first and second stages. In such a multi-string binary digital converter, the first stage uses the first string for converting a group of higher order bits of an N-bit digital word and the second stage using the second string to decode the remaining, lower order bits.

It will be understood that conventional DACs and correspondingly analog to digital converters (ADC's) use multi-stage devices with digital redundancy and in certain environments have a separate resolution per stage. Within the context of the present teaching such DACs may be used, or indeed a DAC configuration where the operational ranges of individual stages may overlap through use of a shared multiplexer may be used.

An example of how the operational ranges of individual stages may overlap through use of a shared multiplexer may be through use of a shared network as part of first and second stages of the DAC architecture. In such a configuration such a shared network provides an intra-string multiplexer, MPX. It will be understood that the term "intra-string" reflects the fact that these switches form part of both the first switching network and the second string and are within or inside both blocks. Elements of this intra-string multiplexer comprise switches which, dependent on the switching configuration, may form part of the first or second DAC stages respectively. It will be appreciated therefore that these switches form part of both stages and can be considered therefore an intra-string multiplexer. In the context of the present teaching, this may be considered a shared multiplexer. In this way, certain selected switches of the first switching network have a dual operation or purpose in that they are shared by the MSB DAC string and LSB DAC string portions of the DAC 100. Individual ones of the shared switches can be configured to selectively couple impedance elements of the first string to the second string or provide at least one LSB transition directly at the output node 130.

When selected or enabled the first or primary function of the selected switch from the intra-string multiplexer 140 is to form part of the $2^{nd}$ impedance string. In this way both sides of the switching network 140 can be selectively coupled. This is a departure from conventional understanding or implementations where just the output side of a switching network was coupled to the output. In this way the switching network 140 of the present teaching provides a dual function for both $1^{st}$ and $2^{nd}$ string.

The reference terminals or nodes are typically coupled to the first string 110 and FIG. 1 illustrates a specific example of a voltage source. As will be appreciated by those skilled in the art the term voltage source is intended to define and include an active voltage supply, a voltage buffer or a current source which is coupled to other circuit elements and configured to provide a target voltage. Within this general definition it will be appreciated that the present teaching should not be limited to any one specific configuration and hence the use of the term reference terminal.

To provide a digital to analog conversion, such DAC circuits provide for a judicious switching of the individual impedance elements to provide a corresponding analog output for an input digital code. It is evident and known to those of skill in the art that the switching networks that are used to couple individual impedance elements also contribute impedance in the overall DAC network.

The example of FIG. 1 is a simple illustrative example of a DAC comprising a $1^{st}$ stage block 110, $2^{nd}$ stage block 160 and an intermediate switch network 140. Using such an exemplary circuit it will be appreciated from the following how, in accordance with the present teaching, it is possible to maintain a substantially constant total switch impedance relative to input code and other variance mechanisms to minimise DC or static errors and thereby maximise precision of the circuit. In this arrangement, a control block 101 is coupled to a DAC switch network 140 and this control loop is used to vary the "ON" gate drive reference level(s) for the switch or multiplexer (MPX) circuit to deliver impedance matched to reference impedance independent of DAC code, common-mode and other variance sources. Examples of these other variance sources include supply, process, reference voltage, stress variation, layout dependent and temperature variations. It will be appreciated that in operation this control block 101 provides a control loop or control circuit to maintain the switch impedance constant verses the input code 101a and a reference value 101b. In this way the control block or control circuit provides a code dependent compensation for, or control of, variances in the response of the switching network 140. The input code 101a may be considered a digital input to the DAC 100 whereas the reference impedance 101b provides an analog input.

Figure 2:
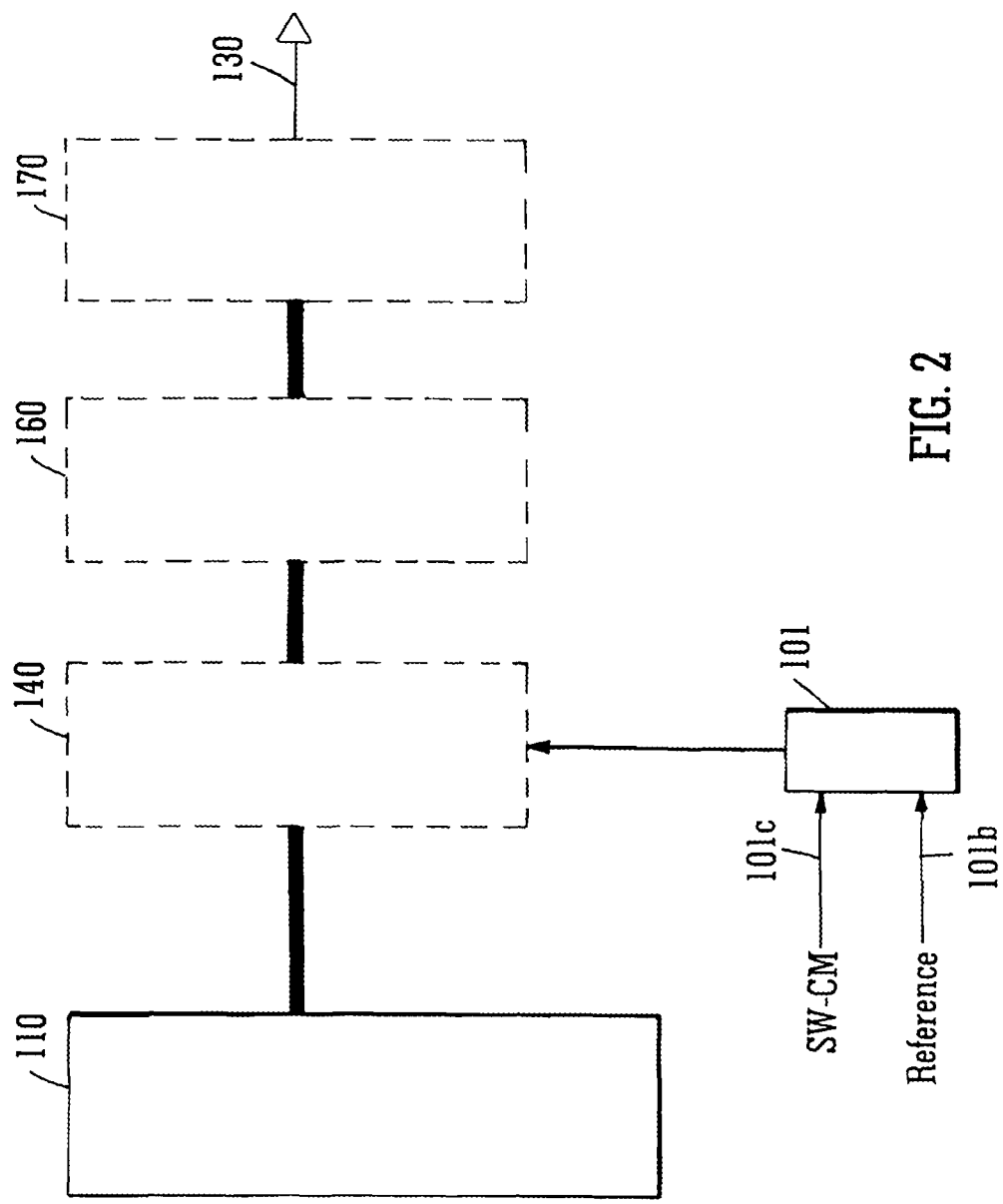
FIG. 2 is a modification to the schematic of FIG. 1.

FIG. 2 shows a modification to the arrangement of FIG. 1 whereby it is possible to vary control signals such that the Ron of the MOS switch(es) (controlled via gate voltages) at the switch common mode level (SW CM shown in FIG. 2) is such that the impedance of the "total" DAC multiplexer (MPX) is substantially controlled verses a reference target impedance. This can be used to control the key, MSB switch Ron and thus improve the precision of the DAC transfer function.

In another configuration the control loop is coupled to an impedance element that is provided in series with the switching network. This may be provided as a shared element which, if shared per signal, will minimize the circuitry required. The control loop is useable to vary the series impedance element to compensate for variations in switch network impedance. It will be appreciated that if provided as a shared new series impedance element it is possible to compensate for variations in switch impedance and control/stabilize this impedance with respect to a target value that can be predetermined. It will be appreciated that advantageously use of a shared element per signal minimizes circuitry can be used.

Figure 3A:
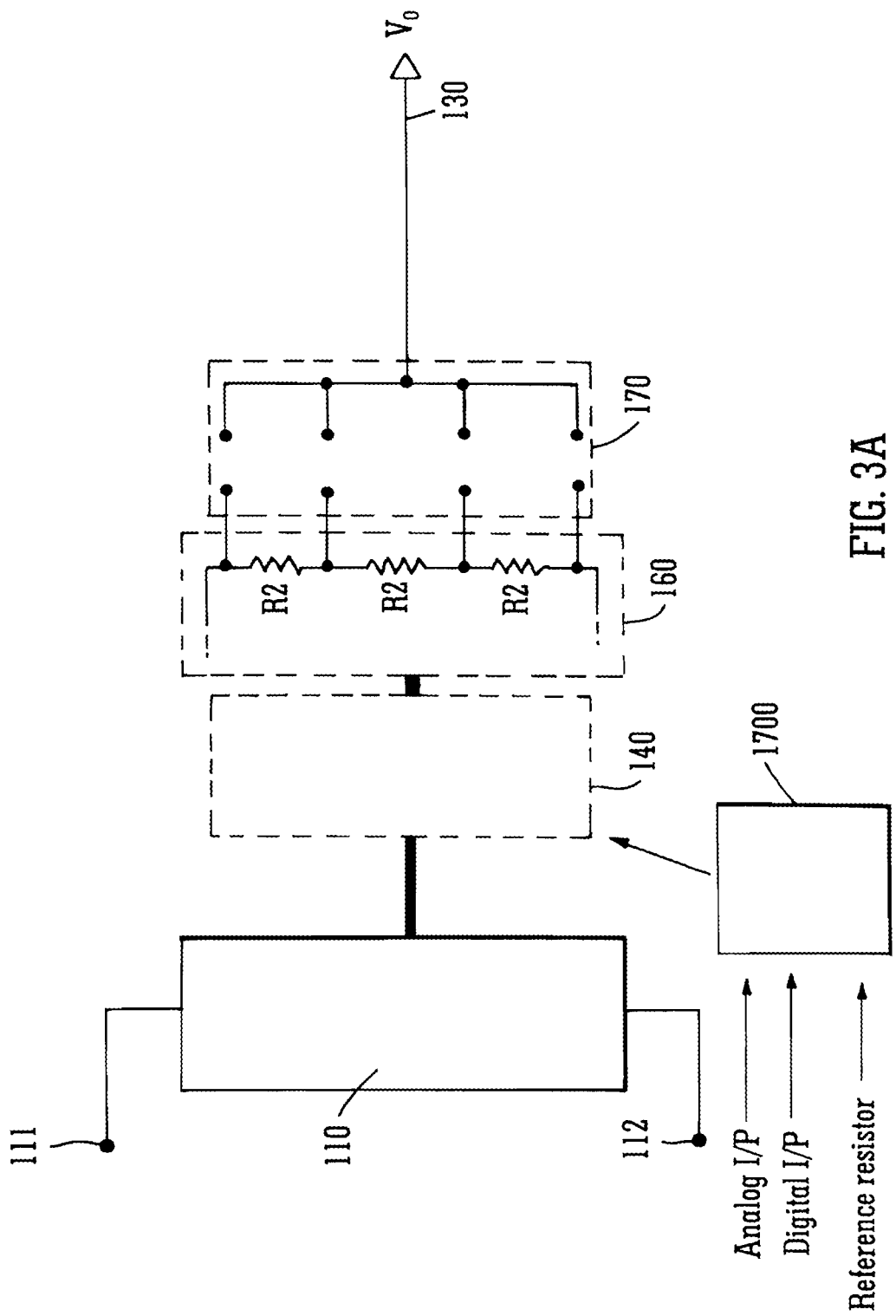
FIGS. 3a and 3b shows an example of how a control circuit may be coupled to a DAC switching network to compensate for errors in the switching network.
Figure 3B:
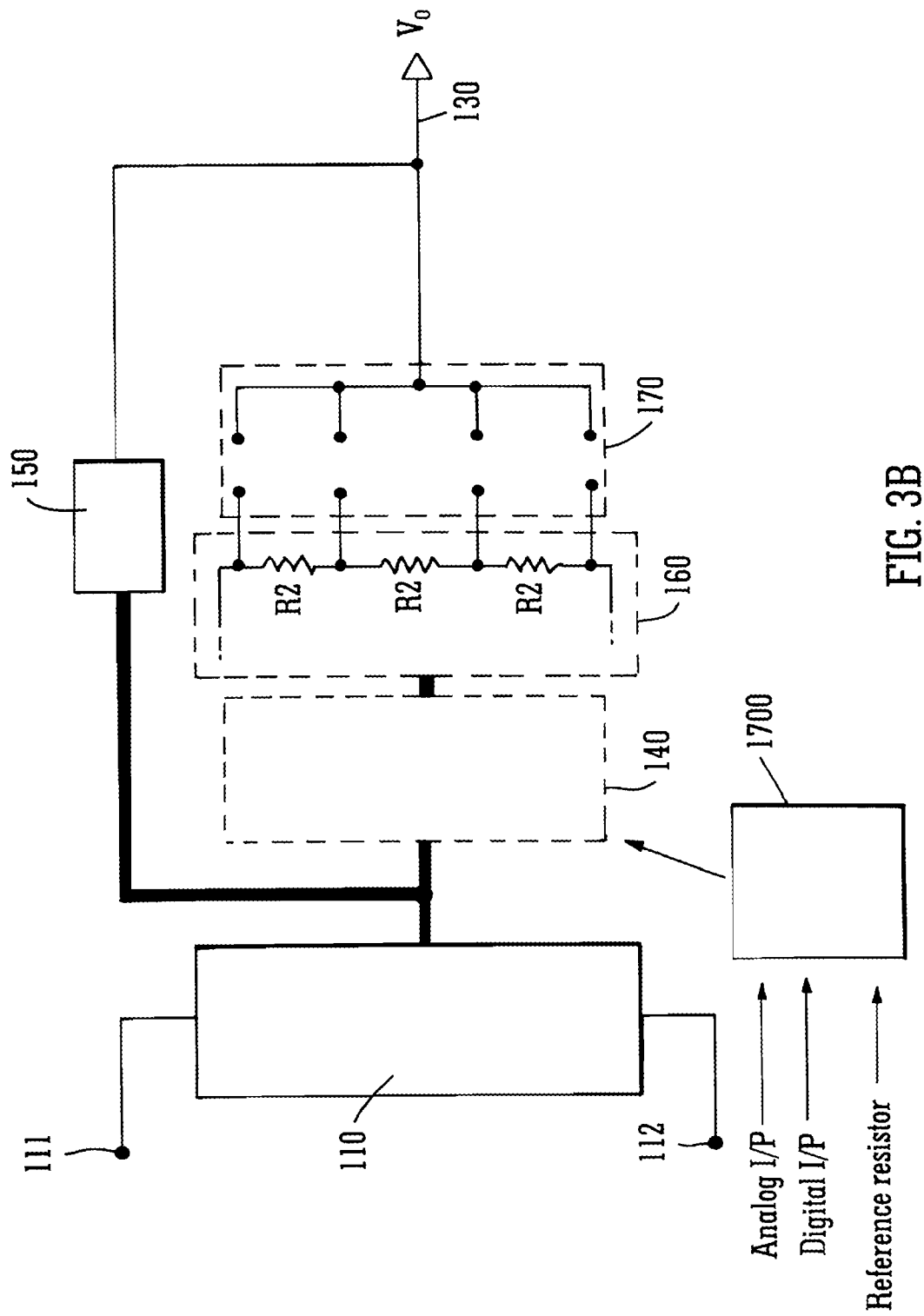

FIGS. 3a and 3b show implementations in schematic form of how a control loop 1700 may be coupled to a switching network. This control loop 1700 is similar in function to the control block 101 of FIG. 2 previously described. This control loop 1700 may be used to vary the "ON" gate drive reference level(s) for the switching circuit to deliver impedance matched to reference impedance independent of DAC code and common-mode and other variance sources. In this way the control loop may provide a compensation for, or control of, one or more of variances resultant from code dependencies, variances in the response characteristics of individual switches of the switching network, a reference compensation for variances in a reference impedance. In such an example the reference impedance may be matched to impedance elements of a resistor string within the DAC. It will be understood that this control may also be used to account for variances due to process, voltage and temperature (PVT) as well as reference voltage variations, package stress and other system variables.

The switching network 140 heretofore described may be considered an intra-string switching network that shares switches between the first and second stages and constitutes a first switching network of the architecture. In FIG. 3b there is also provided a second switching network 150 comprising non-current carrying switches which are configured to provide at least one least significant bit, LSB, transition at the output node in response to a digital input signal. It will be appreciated that when referring to these switches as non-current carrying switches that:

1) this is a reference to the use of the switches in a DC sense, as they pass current during transitions or changes and;
2) there may be some low level leakage, but this leakage is low enough to make DAC substantially insensitive to the Ron of these switches.

It will be appreciated therefore that terminals of the first string 110 are coupled to two blocks, the first block 140 being an intra-string multiplexer between each of the first and second DAC strings and a second block 150 being a sensing network that directly couples the first DAC string terminal voltages to the output 130. Each of the first 140 and second 150 blocks comprises switches and as such may be considered in block format as switching networks. In the schematic of FIG. 3b the coupling of the first string to the second block 150 is shown by way of a single line. It will be appreciated that this is for ease of presentation only and that it is not intended to convey the impression that all of the resistors are commonly coupled to the second block 150. Those of ordinary skill will appreciate that each of the resistors could be individually coupled by means of judicious switching to the block 150.

The switching networks may comprise multiple switches of different switch types and the control loop 1700 may be configured to compensate for variances in the response characteristics of the individual switches different types.

It will be appreciated that typically the switches of such a switching network 140 are provided by MOS devices and in this way it may be possible to vary control signals such that the Ron of the MOS switch(es) which is controlled via gate voltages at the switch common mode level is such that the impedance of the overall DAC switching circuit is substantially controlled verses a reference target impedance. The reference target may be determined by inputs provided to such a control block 1700 by one or more of a digital input, an analog input or a reference resistance.

As a variant to providing this control via a tuning of the gate voltages, it is possible within the context of the present teaching to use the control block to provide a bulk-biasing for tuning of the MOS Ron characteristic. It is known that Reverse Back gate biasing or reverse bulk biasing (RBB) is particularly advantageous for low power applications. As the nomenclature implies, it is similar to but complementary to forward bulk biasing (FBB) which as will be known by those of skill is typically used for high performance/speed and high power digital applications. In the context of the present teaching, the present inventor has found that RBB may be more useful to avoid leakage paths contributing to errors. Where such RBB is modulated or changed it is known as Adaptive Bulk Bias (ABB) and is similar in broad concept in terms of tuning/varying the MOS characteristic.

It will be understood by those of skill in the art that conventionally MOS devices are often considered as having three control terminals—source, drain, and gate. The tuning heretofore has been described with reference to a tuning of the gate control to maintain the substantially constant impedance levels. The MOS device does however also include a body/bulk/well terminal and the gate is typically separated from the body by an insulating layer. It will be appreciated by those of skill that voltage differences between the source and body/bulk/well of the MOS device contribute to what is commonly known as the body effect. The body of the MOS device can be considered as providing a second gate, sometimes referred to in the art as a back-gate, of the device which helps determine when the device is switched on and off. The use of RBB/ABB, per the present teaching, enables a maximum use of supply range for Vgs and uses extra control range on the gate terminal as a new and additional degree of freedom in operation of DACs and in string DAC design.

It will be appreciated that certain configurations may uses gate control and the other configurations may use back-gate control. Combinations of both are also possible and within the context of the present teaching gate control will be understood as meaning either or both of conventional gate or back-gate control of the MOS device.

As shown in FIG. 3A, this compensation or control will typically have greatest effect in those current carrying switching networks—i.e. those switching networks 140, 170, that provide a coupling between successive strings of the multi-string DAC. In the example of a two stage DAC, this would be the first switching network of the DAC, i.e. the switching network 140 that couples a MSB DAC stage to subsequent stages. In such an arrangement it may be used to control this key, MSB switching network Ron and thus improve the precision of the DAC transfer function.

Figure 4:
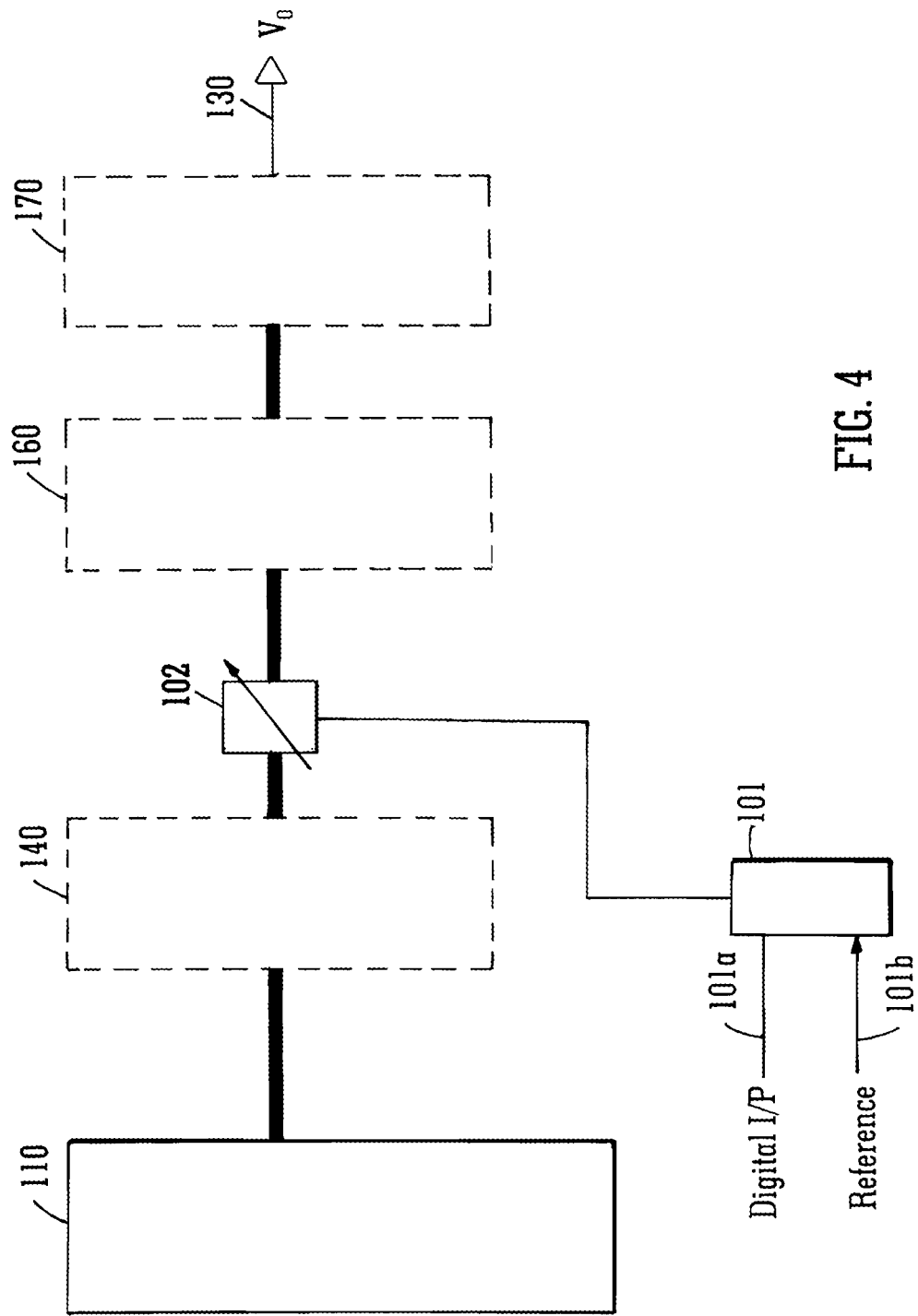
FIG. 4 shows in block form the inclusion of a series impedance which may be used to provide Ron control of a switched network.

In another configuration shown in FIG. 4, the control loop 101 is coupled to an impedance element 102 that is provided in series with the switching network 140. In the schematic of FIG. 4 this is shown in series between the blocks 140 and 160. It will be appreciated that this could equally be provided between the blocks 110 and 140, albeit in this configuration multiple such impedance elements 102 may be required to couple each of the individual paths from the first string to the second string. The impedance element may be provided as a shared element which, if shared per signal, will minimize the circuitry required. The control loop is useable to vary the series impedance element to compensate for variations in switch network impedance. It will be appreciated that if provided as a shared new series impedance element it is possible to compensate for variations in switch impedance and control/stabilize this impedance with respect to a target value that can be predetermined. It will be appreciated that advantageous use of a shared element per signal minimizes circuitry.

FIG. 5 shows different examples of how such a control loop may be provided. As shown in FIG. 5A, it is possible to control Ron of the DAC switching network with reference to a matched reference resistance Rref. The reference resistance and the switches may be implemented in series and/or parallel combinations and in accordance with conventional understanding multiple series resistors are often used to increase Vr_ref-Vcm_buf and multiple switches may also be used in series in SWRef. In this way Iref1 and Iref2 may mimic DAC current, or be optimized in overall design. It will be appreciated that use of substantially matched current sources is useful. While the schematic provided illustrates basic core principles it will be understood that best practice design considerations with respect to amplifier design techniques and current mirrors may also be used—such techniques including matching, calibration, trimming, chopping, autozeroing and shuffling. Furthermore when considering optimal design layout it will be appreciated that it is possible to adopt specific approaches to minimize and match Layout Dependent Effects (LDEs).

Figure 5A:
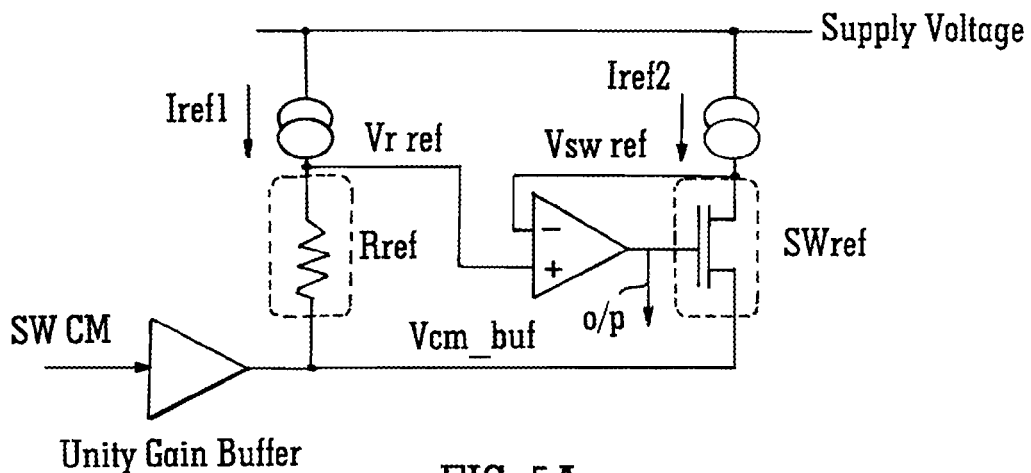
FIGS. 5A-5E shows various examples of how a multi-string impedance control circuit may be implemented.
Figure 5B:
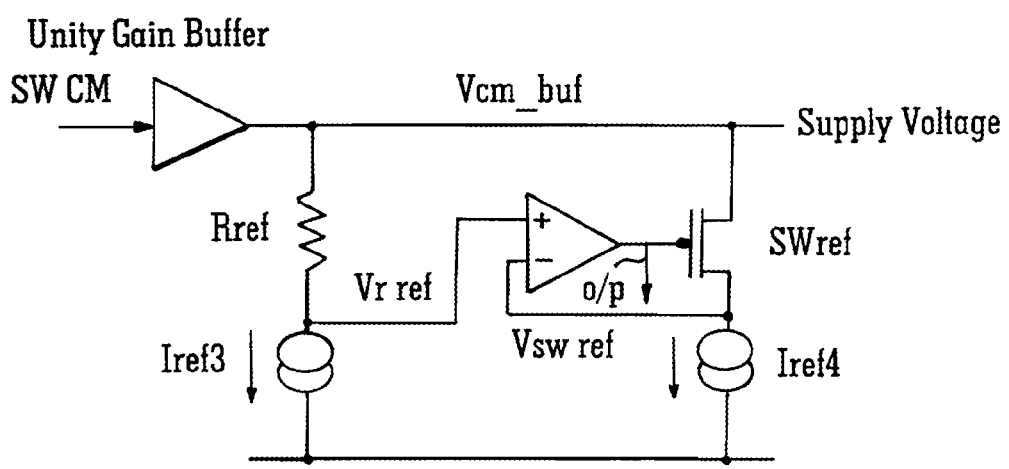

FIG. 5B illustrates a specific PMOS implementation which may be usefully employed to provide switch impedance control. This PMOS example uses substantially the same architecture as that described above. When considering the use of current sources or sinks it will be appreciated that a current sink may be used instead of current source for NMOS in some cases (where headroom is limited). Current sources/sinks of one polarity may be useable and desirable in cases where there is sufficient headroom to minimize circuitry. It will be further appreciated that operational amplifiers (opamps) may be shared between multiple reference circuits as both the inputs to the opamp and the load gate terminal are all high impedance gate terminals. Furthermore it is possible to use differing current densities in order to optimize the design, de-sensitizing it to non-idealities such as mismatch and parasitic IR drops.

Figure 5C:
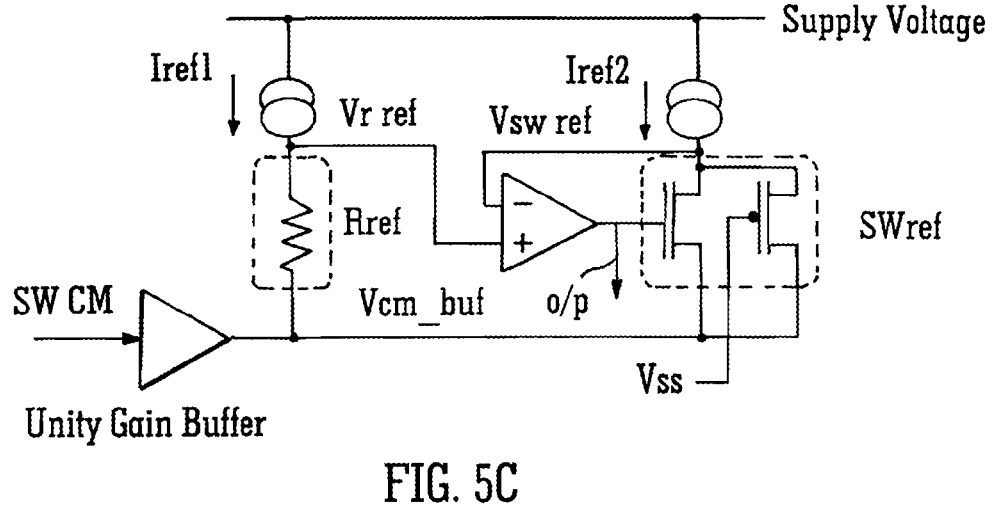

FIG. 5C shows an example of how it is possible to control the Ron at DAC switch (SW) Common-mode (CM) by matching it to a reference resistance Rref using a NMOS device in the switching network 140 as the impedance control element. In such an implementation only one impedance control element may be necessary by design and as such it represents an advantageous implementation which minimizes the complexity required. It will be further appreciated that it is also possible to have other variants e.g. "on" NMOS in parallel with a controlled PMOS and these and other modifications will be appreciated by those of ordinary skill and should be considered as falling within the scope of the instant application. In this context it will be appreciated that the present teaching should not be construed as being limited to MOS devices or specific variants thereof.

Figure 5D:
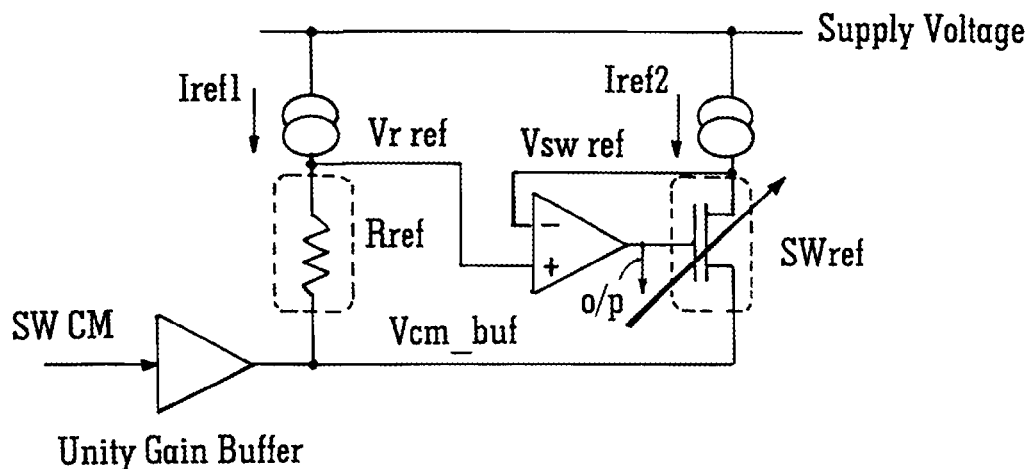

FIG. 5D shows how it is possible to match the Ron at DAC SW Common-mode (CM) to a reference resistance Rref and a switchable reference switch so as to mimic DAC switch selection. In this configuration the Rref and Switches may be series/parallel combinations—it will be appreciated that a series implementation is preferred as it allows an increase in voltage range. In this way those of skill will appreciate that multiple series resistors are useable to increase Vr_ref-Vcm_buf. In a similar fashion multiple switches may also be used in series in SWRef also. The values of Iref1 and Iref2 may mimic DAC current, or be optimized in overall design (usually preferred). Substantially matched current sources are ideal, but as the signal levels are very small an analysis of Ron vs Ibias shows that at low current levels substantially different currents can be used with little impact on Ron mismatch as part of circuit optimization.

For an NMOS configuration, it will be understood that in a negative transitions there will be a larger Vgs during the settling process which provides a low impedance during the transient condition and this will settle at the same time as the overall DAC settling. However in a rising condition, there is a reduction in the Vgs which has a corresponding effect on providing a high impedance which increases the settling time. For large steps the NMOS device can be substantially turned off during a transient which could have a detrimental effect on the settling behaviour of the overall DAC.

Figure 5E:
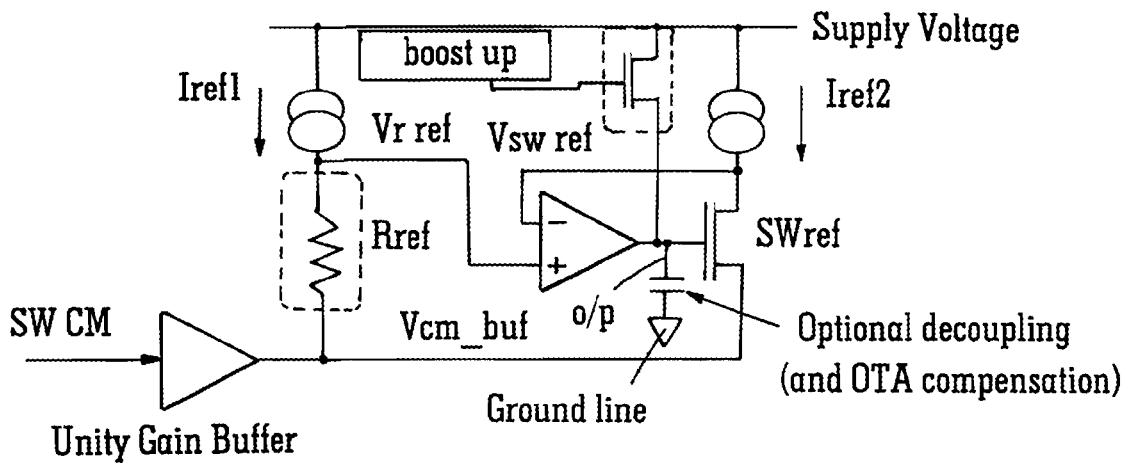

FIG. 5E shows how, in an NMOS implementation, a boost may be provided to compensate for delays in responsiveness of the control loop to switching requirements. The boost circuit can be responsive to a digital input signal to provide compensation for transient conditions where the responsiveness of the circuit may not otherwise be sufficient to react in time to the changes in the input word for satisfactory transient performance. This is particularly problematic where there is a large scale transition up.

While not shown in FIG. 5E additional circuitry could equally be provided to allow for compensating in negative transitions. It will also be appreciated that the configuration shown in FIG. 5E is for a NMOS implementation and would change for a PMOS implementation as will be appreciated by those of skill.

In summary, various implementations may be provided including:

Transition down—operational transconductance amplifier (OTA) can drive directly & settle.

Transition up—The OTA's finite, relatively limited bandwidth verses the process digital switching speed will generally mean the OTA is too slow to match the fast switching speed desired and a transient boost up is suggested and ideally such a boost up may be provided by use of a global/shared boost signal locally gated, synchronizing updates and minimizing per-channel logic.

It will be appreciated that the above exemplifies how multiple reference switch circuits may be used to match the circuitry used for a particular code configuration in the DAC. In accordance with such teaching at least one MOS device can be varied in the multi-string DAC multiplexer to compensate for variances that would otherwise affect the DAC transfer function. It will be appreciated that such a control circuit enables control of the impedance of the DAC switch in all cases. This does not require a reference switch of each switch type as the reference switches and resistors can be scaled also, providing a degree of freedom to the designer. It will be further understood that where described as a single switch that the switches of the present teaching may be provided as combinations of multiple devices in series with different forms of decode It will be appreciated that those non-current carrying switches described heretofore can be fabricated in accordance with such design variations since they are not on resistance sensitive and more sensitive to device leakage and capacitance.

It will be understood that where the reference terminals of one or more of the first or second string were described as being driven by voltage sources/buffers/followers or coupled to passive or active networks that these could be implemented as a sub-part of a high-level circuit and the present teaching is not intended to be limited to any one specific implementation.

Optimisation of the DAC can be achieved in a number of different ways and it will be appreciated that the precision of the DAC network, rather than the switches in isolation, is not sensitive to the Ron of the switches. As part of this optimisation it is possible to use parasitic (interconnect) extraction or full layout extraction. Parasitic impedance as part of the overall DAC design can be integrated into the optimization and the switch circuit may include a series resistance element of the same type of resistor or resistance material as R1 and/or R2, parasitic impedances. Other considerations include wafer fabrication variances and lot-to-lot variation, package stress consideration and layout dependence effects (LDEs). Any further developments or inventions in terms of the controlled impedance switch design can be used here also. These and other aspects will be appreciated by those of ordinary skill.

It will be understood that where the elements or devices that are used to fabricate the individual strings of the DAC are described with reference to resistors having a resistance that these are specific examples of impedance elements each having an associated impedance. The present teaching is not to be construed as being limited to resistors and resistance and other examples of impedance elements may be used within the overall context of the present teaching.

It will be appreciated that the present teaching describes MOS switches for the operation of the exemplary circuits described. However it will be understood that the operation of the present teaching is not limited to MOS switches and can be employed using Junction Field Effect Transistors (JFET) switches, Metal Semiconductor FET (MESFET) or High Electron Mobility Transistors (HEMT) or any other switching scheme used in converters. In this context MOS includes high relative permittivity (k) dielectric materials and is not limited to oxide based material fabrication. Furthermore, it will be appreciated that MOS devices are not manufactured using metal-oxide-semiconductor construction in modern technologies but this is the conventional term used to described generically modern "CMOS processes" including those implemented using poly gate or non-oxide insulation layer.

Other embodiments are within the spirit and scope of the appended claims. For example, due to manufacturing variances and second order non-ideal conditions, the nominal values of R1, R2, and Ron may be adjusted to give optimum results. Monte Carlo analysis, other statistical analysis or analog design optimization tools and methodologies may be used to perform this optimization. Further, various technologies may be used for the switches, such as CMOS transmission gates, one MOS transistor type (e.g., NMOS or PMOS), either of the above with a single, or plurality of, series resistors on one or both sides of the switch. Still further, two parallel resistor strings may be used.

While the present teaching has been described heretofore with reference to specific examples of conventional binary numbering arrangements as these represent commonly favoured and widely used implementations. However the present teaching should not be construed as being limited to such implementations as the teaching has application in non-binary base arrangements or different numbering systems such as for example relative primes.

Within the context of the present teaching the overall DAC resolution is a combination of the individual contributions by each of the stages. In the context of providing a binary DAC resolution one or more of the individual stages may provide a non-binary contribution. The number of states provided by an architecture in accordance with the present teaching can be equal to or greater than that actually required and this may prove useful in circuit optimisation.

Where the present teaching describes specific features or elements with reference to one particular figure, it will be appreciated that those features or elements could be used with other features or elements without departing from the spirit or scope of the claimed teaching.

The words "comprises/comprising" and the words "having/including" when used herein with reference to the present invention are used to specify the presence of stated features, integers, steps or components but does not preclude the presence or addition of one or more other features, integers, steps, components or groups thereof.

The present teaching is not limited to the embodiments hereinbefore described but may be varied in both construction and detail.

The invention claimed is:

1. A multistage digital to analog converter, DAC, comprising an output node and a plurality of DAC stages, at least one of the DAC stages comprising a string comprising a plurality of impedance elements coupled to a switching network comprising switches configured to provide at least one state change at the output node in response to a sensed change across the switching network, the DAC further comprising a control circuit coupled to the switching network and configured to provide code dependent compensation for, or control of, variances in the response of the switching network.

2. The DAC of claim 1 wherein the control circuit is responsive to changes in the input code to the DAC.

3. The DAC of claim 2 wherein the control circuit is coupled to a digital input of the DAC.

4. The DAC of claim 3 wherein the control circuit is configured to provide a variation in an output voltage of the control circuit in response to changes in an input code to the DAC.

5. The DAC of claim 4 wherein the switching network comprises switches of different switch type.

6. The DAC of claim 4 wherein the switching network comprises switches of the same switch type.

7. The DAC of claim 1 wherein the control circuit is coupled to a reference impedance.

8. The DAC of claim 7 wherein the control circuit is configured to provide compensation, or control, of, variances in response characteristics of one or more switches relative to the reference impedance.

9. The DAC of claim 8 wherein the control circuit is further configured to provide compensation for variances in the reference impedance.

10. The DAC of claim 8 wherein the reference impedance is matched to one or more impedance elements of an impedance string within the DAC.

11. The DAC of claim 1 wherein the control circuit is responsive to a control signal indicative of a change in the DAC code, the control circuit comprising a driver circuit providing a change in the gate level of a MOS device coupled to the switching network in response to a transition reflected by a change in the DAC code.

12. The DAC of claim 11 wherein control circuit comprises an operational amplifier.

13. The DAC of claim 1 wherein the control circuit comprises an operational amplifier providing a buffer and further comprises a boost element configured to compensate for delays in response characteristics of the operational amplifier to respond to changes in a DAC transition being effected using the switching network.

14. The DAC of claim 1 wherein at least one switch of the switching network comprises a MOS device and the control circuit is configured to vary voltages applied to a gate of the MOS device to provide compensation for, or control of, variances in the response of the switching network.

15. The DAC of claim 1 wherein at least one switch of the switching network comprises a MOS device and the control circuit is configured to vary voltages applied to a backgate of the MOS device to provide compensation for, or control of, variances in the response of the switching network.

16. The DAC of claim 1 comprising:
a first string with a plurality of impedance elements;
a second string with a plurality of impedance elements;
a first switching network adapted to couple a voltage produced across a at least one of the impedance elements in the first string across the second string in response to a digital input signal, said digital signal comprising a digital bit stream, the impedance elements in the second string configured to produce voltages in response to current passing from the first string through the first switching network to the second string to produce a corresponding analog signal to said digital input signal to an output node,
a second switching network comprising non-current carrying switches configured to provide at least one least significant bit, LSB, transition at the output node in response to a sensed change across the first switching network, and wherein the control circuit is coupled to the first switching network.

17. The DAC of claim 16 wherein switches of the first switch network are shared with the second string.

18. The DAC of claim 16 wherein the second string is configured to provide a loading effect across the first switching network and at least one resistor of the first resistor string.

19. The DAC of claim 1 wherein the control circuit is coupled to other switches of the DAC and is configured to provide code dependent compensation for, or control of, variances in the response of those switches.

20. A multistage digital to analog converter, DAC, comprising a plurality of DAC stages coupled via a switching network, the switching network comprising at least one MOS device, and further comprising switches configured to provide at least one state change in response to a sensed change across the switching network, the DAC further comprising a control circuit coupled to a gate terminal of the at least one MOS device and configured to vary voltages applied to the gate to provide compensation for, or control of, variances in the response of the switching network.

21. The DAC of claim 20 wherein the gate terminal is a back-gate terminal.

22. The DAC of claim 20 wherein the control circuit is configured to provide a code dependent compensation.

23. The DAC of claim 22 wherein the control circuit is coupled to a digital input of the DAC.

24. The DAC of claim 23 wherein the control circuit is configured to provide a relationship between an input code of the DAC and an output voltage of the control circuit that is used to provide the compensation.

25. The DAC of claim 20 wherein the control circuit provides compensation for, or control f, variances in the response characteristics of individual switches of the switching network.

26. The DAC of claim 25 wherein the control circuit is coupled to an analog input of the DAC.

27. The DAC of claim 20 wherein the control circuit is coupled to a node within the DAC and is responsive to changes in the operation of the DAC.

28. A method of converting a digital input signal to a corresponding analog output, the method comprising
Providing a digital bit stream to a digital to analog converter, DAC, the DAC comprising a plurality of DAC stages, at least one of the DAC stages comprising a string comprising a plurality of impedance elements coupled to a switching network,
Sensing a state change across the switching network, and
Providing a control circuit coupled to the switching network and
Detecting variances in the response of the switching network and in response to detection of said variances using the control circuit to provide code dependent compensation for, or control of, said variances.

* * * * *